(12) United States Patent
Zhang et al.

(10) Patent No.: US 9,287,433 B2
(45) Date of Patent: Mar. 15, 2016

(54) RADIATION DETECTOR

(71) Applicants: Tsinghua University, Beijing (CN); Nuctech Company Limited, Beijing (CN)

(72) Inventors: Lan Zhang, Beijing (CN); Yulan Li, Beijing (CN); Yuanjing Li, Beijing (CN); Yinong Liu, Beijing (CN); Jianqiang Fu, Beijing (CN); Hao Jiang, Beijing (CN); Wei Zhang, Beijing (CN); Yanqing Liu, Beijing (CN); Jun Li, Beijing (CN)

(73) Assignees: Tsinghua University (CN); Nuctech Company Limited (CN)

( * ) Notice: Subject to any disclaimer, the term of this patent is extended or adjusted under 35 U.S.C. 154(b) by 0 days.

(21) Appl. No.: 14/164,702

(22) Filed: Jan. 27, 2014

(65) Prior Publication Data
US 2014/0209809 A1 Jul. 31, 2014

(30) Foreign Application Priority Data
Jan. 31, 2013 (CN) .......................... 2013 1 0038954

(51) Int. Cl.
*H01L 31/115* (2006.01)
*G01T 1/24* (2006.01)

(52) U.S. Cl.
CPC .............. *H01L 31/115* (2013.01); *G01T 1/241* (2013.01)

(58) Field of Classification Search
CPC .............................. G01T 1/241; H01L 31/115
See application file for complete search history.

(56) References Cited

U.S. PATENT DOCUMENTS

| | | | | |
|---|---|---|---|---|
| 5,677,539 A * | 10/1997 | Apotovsky et al. | ...... | 250/370.13 |
| 6,169,287 B1 * | 1/2001 | Warburton | ................ | 250/370.1 |
| 6,175,120 B1 * | 1/2001 | McGregor et al. | ....... | 250/370.13 |
| 7,223,982 B1 * | 5/2007 | Chen et al. | ............... | 250/370.13 |
| 2011/0019794 A1 * | 1/2011 | Roessl et al. | .................... | 378/19 |

* cited by examiner

*Primary Examiner* — David Porta
*Assistant Examiner* — Mindy Yu
(74) *Attorney, Agent, or Firm* — Schwegman Lundberg & Woessner, P.A.

(57) ABSTRACT

A radiation detector is provided. The radiation detection comprises a semiconductor crystal for detecting radiation. The semiconductor crystal comprises a top surface, a bottom surface, and at least one side surface. At least one anode is arranged on at least one of the top surface, the bottom surface, and the at least one side surface. At least one cathode is arranged on at least another one of the top surface, the bottom surface, and the at least one side surface. The at least one anode each has a stripe shape, the at least one cathode each has a planar or curved shape, and the at least one cathode and the at least one anode extend in parallel with respect to each other to a length substantially equal to that of the anode. Such an electrode structure can improve energy resolution and detection efficiency of the radiation detector effectively.

20 Claims, 5 Drawing Sheets (a)

(b)

(a)                (b)

(c)                (d)

RADIATION DETECTOR

PRIORITY CLAIM AND RELATED APPLICATION

This application claims the benefit of priority under 35 U.S.C. Section 119 to Chinese Patent Application Serial No. 201310038954.7, filed Jan. 31, 2013, which application is incorporated herein by reference in its entirety

TECHNICAL FIELD

The present disclosure relates to radiation detectors.

BACKGROUND

Radiation detectors can be used to measure energy spectrum of rays such as X-RAYs or γ-rays, and thus are one of the major approaches in nuclide recognition. The radiation detectors have been widely used for detection of radioactive substances in, e.g., nuclear radiation protection, nuclear security check, environment protection, and national security, etc. Currently, the radiation detectors can be generally categorized into two types, including scintillator detectors represented by a NaI (TI) detector and semiconductor radiation detectors represented by a high-purity Ge (HPGe) detector.

The scintillator detectors have advantages such as low price and simple manufacturing process. On-site portable γ-spectrometers are typically implemented by the scintillator detectors, e.g., the NaI or CsI detectors. However, the scintillator detectors have a low energy resolution and thus cannot meet measurement requirements of fine structures of complex spectrums. The semiconductor HPGe radiation detectors have a high energy resolution. However, most of the semiconductor HPGe radiation detectors need to be reserved or used in liquid $N_2$ at about 77 K and thus need low-temperature containers and vacuum chambers, which will increase a total size of the detectors. Furthermore, the liquid $N_2$ needs to be refilled frequently, which is inconvenient for fieldwork and accordingly limits the application of such detectors.

Compound semiconductor radiation detectors have many advantages such as high energy resolution and high detection efficiency. Also, they are small in size and portable, and can operate at room temperature. The semiconductor radiation detectors have been widely used in, e.g., environment monitoring, nuclear medical science, industrial nondestructive testing, security check, nuclear weapon penetration, aviation, aerospace, astrophysics, and high-energy physics, etc. Recently, extensive research has been done on various semiconductor materials including Ge, $HgI_2$, GaAs, TiBr, CdTe, CdZnTe, CdSe, GaP, HgS, $PbI_2$, and AlSb, etc. Research results show that the CdZnTe has an excellent performance at the room temperature and is a promising material for manufacturing the semiconductor radiation detectors.

The semiconductor radiation detector, e.g., one made of CdZnTe, may have a relatively high atomic number (48, 30, 52) and a large density (6 $g/cm^3$) compared to the NaI scintillator detector, which enables a high detection efficiency of high-energy γ and X-RAYs. The CdZnTe has a bandwidth of about 1.5~2.2 eV and has a good performance at the room temperature. Furthermore, CdZnTe crystal of high quality has a substantially stable performance within a large range of temperature. In the CdZnTe, it consumes about 4.6 eV to generate a pair of charge carriers, while in the NaI scintillator, the energy to be consumed is about 100 eV. As a result, statistical fluctuation of the number of charge carriers induced by rays in the CdZnTe is smaller than that in the NaI scintillator. Furthermore, the CdZnTe has a resistance above $10^{10}\Omega$, which ensures low leakage current noise, thereby improving the energy resolution.

However, the carriers in the CdZnTe crystal have a short drifting length $L_h$ because cavities in the CdZnTe crystal have a short lifetime and low mobility, resulting in a small value of $\mu_h\tau_h$. Carriers in different locations of the semiconductor crystal may contribute differently to a pulse amplitude. As a result, the energy resolution of the semiconductor radiation detector may deteriorate.

This type of semiconductor radiation detector is often designed to have an electrode structure with sensitivity to a single polarity in order to improve the energy resolution thereof. Charges generated from reaction between the rays and the crystal will move toward two opposite electrodes under an electric field produced by a specially-designed electrode structure. In particular, electrons will move toward an anode while cavities will move toward a cathode. The electric field has a low intensity in locations far away from the electrode so that cavities moving at a low speed are easy to be trapped. In contrast, the electrons, which move at a high speed and are thus not easy to be trapped, are finally collected by the electrode. In this way, the detector sensitive to the single polarity can be implemented. Such a detector can alleviate negative effects on the energy resolution due to the low migration speed of the cavities. However, the electrons may be trapped because of crystal defects, causing fluctuations in signal amplitudes at the collection electrode generated by charges produced in different locations of the semiconductor crystal. This may also deteriorate the energy resolution of the radiation detector.

Moreover, radiation detectors having a coaxial structure comprise a hole in a center of the crystal and the electrodes are arranged in the hole. However, it is difficult to drill the hole in the crystal and mechanical damages may be caused in fragile crystals. Such damages may introduce defects near the electrodes, thereby degrading efficiency of signal collection.

Therefore, it is desired to improve the electrode design so as to enhance the energy resolution and detection efficiency of the radiation detector.

SUMMARY

The present disclosure provides, among others, a radiation detector having an electrode structure that can improve its energy resolution.

According to an aspect of the present disclosure, there is provided a radiation detector, including: a semiconductor crystal for detecting radiation, the semiconductor crystal including a top surface, a bottom surface, and at least one side surface; at least one anode arranged on at least one of the top surface, the bottom surface, and the at least one side surface; and at least one cathode arranged on at least another one of the top surface, the bottom surface, and the at least one side surface, wherein the at least one anode each has a stripe shape, the at least one cathode each has a planar or curved shape, and the at least one cathode and the at least one anode extend in parallel with respect to each other to a length substantially equal to that of the anode.

Optionally, the semiconductor crystal may be used for detecting X or γ-rays. Semiconductor crystals capable of detecting other types of rays may also be used.

Optionally, the semiconductor crystal may have a cuboid shape. The top surface and the bottom surface may be two arbitrary opposite surfaces of the cuboid, respectively. The at least one side surface may include the other four surfaces of the cuboid.

Optionally, the semiconductor crystal may have a cube shape. The top surface and the bottom surface may be two arbitrary opposite surfaces of the cube, respectively. The at least one side surface may include the other four surfaces of the cube.

Optionally, the semiconductor crystal may have a semi-cylinder shape. The top surface and the bottom surface may be a longitudinal-section surface and an arc surface of the semi-cylinder, respectively. The at least one side surface may include two cross-section surfaces of the semi-cylinder.

Optionally, the semiconductor crystal may have a segment shape. The top surface and the bottom surface may be a longitudinal-section surface and an arc surface of the segment, respectively. The at least one side surface may include two cross-section surfaces and two radial-section surfaces of the segment.

Optionally, the at least one anode may be arranged centrally on the at least one of the top surface, the bottom surface, and the at least one side surface in a substantially symmetric manner.

Optically, the at least one anode may each include a plurality of sub-anodes extending in parallel with respect to each other.

Optionally, the at least one anode may be arranged on at least one of the top surface and the bottom surface of the semiconductor crystal.

Optionally, the at least one anode may be arranged on at least one of the top surface of the semiconductor crystal and the side surfaces adjoining the top surface.

Optionally, the at least one cathode may each cover the entire surface, on which it is arranged, of the semiconductor crystal.

Optionally, the at least one anode may be arranged on the top surface of the semiconductor crystal, and the at least one cathode may be arranged on the bottom surface of the semiconductor crystal and the side surfaces adjoining the bottom surface.

Optionally, the at least one cathode may each extend, on the side surfaces adjoining the bottom surface, from the bottom surface toward the top surface without reaching the top surface.

Optionally, the at least one cathode may each extend, on the side surfaces adjoining the bottom surface, from the bottom surface toward the top surface to different heights with respect to each other.

Optionally, respective edges between the bottom surface and the side surfaces adjoining the bottom surface may be rounded off.

Optionally, the at least one cathode may each be partially removed at the respective edges between the bottom surface and the side surfaces adjoining the bottom surface.

Optionally, respective edges between the top surface and the side surfaces adjoining the top surface may be rounded off.

Optionally, the radiation detector may further include grooves formed in the surface of the semiconductor crystal at opposite sides of each of the at least one anode and in parallel thereto.

Optionally, the radiation detector may further include protective conductors formed on the surface of the semiconductor crystal at opposite sides of each of the at least one anode and in parallel thereto.

Optionally, the protective conductors and the at least one anode may be arranged on a same surface of the semiconductor crystal.

Optionally, the protective conductors and the at least one anode may be arranged on surfaces of the semiconductor crystal adjoining to each other, respectively.

Optionally, the protective conductors may be arranged on respective edges between the surface, on which the at least one anode is arranged, and surfaces adjoining thereto.

Optionally, the semiconductor crystal may be any one of Ge, $HgI_2$, GaAs, TiBr, CdTe, CdZnTe, CdSe, GaP, HgS, $PbI_2$, and AlSb.

In the radiation detector according to the present disclosure, the stripe anode and the planar or curved cathode are formed on the surfaces of the semiconductor crystal, which may effectively avoid degradation of the efficiency of signal collection and the energy resolution caused by mechanical damages because it is not necessary to drill holes in the semiconductor crystal. The structure including the strip anode and the planar or curved cathode may generate in the semiconductor crystal an electric field having a higher intensity than a structure including a planar anode and a planar cathode with a same voltage being applied thereto. Therefore, the structure according to the present disclosure can be applied to a large-size semiconductor crystal to improve detection efficiency.

Under an electric field applied by the electrode structure according to the present disclosure, charges produced from reaction between rays and the semiconductor crystal will move toward the two opposite electrodes under the effect of the electric field. In particular, electrons will move toward the stripe anode while cavities will move toward the planar or curved cathode. The electric field has a relatively low intensity at locations far away from the stripe anode so that the cavities moving at a low migration speed are easy to get trapped. In contrast, the electrons, which move at a high speed and are thus not easy to be trapped, are finally collected by the electrode. In this way, a radiation detector sensitive to a single polarity can be implemented, which can avoid degradation of the energy resolution and fluctuation of signal amplitude caused by crystal defects and massive cavities trapping.

According to an optional embodiment, the anode may include a plurality of sub-anodes extending in parallel with respect to each other. A desired electric field distribution can be generated in the semiconductor crystal by applying different voltages on the respective sub-anodes, so as to improve efficiency of charge collection and remove a high-energy trail in energy spectrum.

According to an optional embodiment, the electric field may be shaped by the protective conductors formed on the surface of the semiconductor crystal or the grooves formed in the surface of the semiconductor crystal at opposite sides of the anode, so as to reduce noise signals caused by surface leakage current.

According to an optional embodiment, the respective edges between the bottom surface of the semiconductor crystal and the side surfaces adjoining the bottom surface of the semiconductor crystal may be rounded off. Alternatively, the cathode may be partially removed at the respective edges between the bottom surface and the side surfaces adjoining the bottom surface. In this way, charge trapping in locations where the electric field intensity is relatively low can be effectively avoided.

According to the present disclosure, the radiation detector sensitive to the single polarity can be implemented with a simple electrode structure. Also, the energy resolution and performances of the radiation detector can be improved without significantly increasing complexity of processing circuitry.

BRIEF DESCRIPTION OF THE DRAWINGS

The foregoing and other objects, features, and advantages of the present disclosure will become more apparent from the following description in connection with embodiments of the present disclosure by making reference to the accompanying drawings, in which.

DETAILED DESCRIPTION

The foregoing and other objects, features, and advantages of the present disclosure will become more apparent from the following description in connection with embodiments of the present disclosure by making reference to the accompanying drawings. Throughout the drawings, similar parts are represented by similar reference numbers and repetitious descriptions thereof are omitted. Respective parts of the drawings are not drawn to scale for the sake of clarity.

Figure 1:
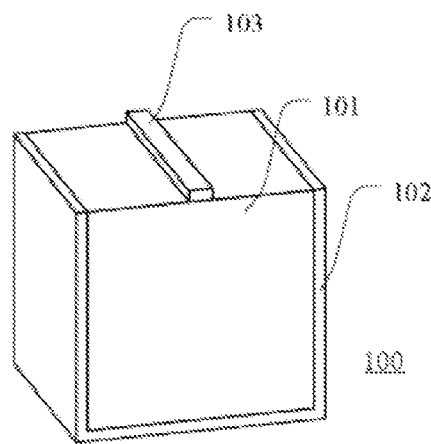
FIG. 1 schematically shows a structural diagram of a radiation detector according to an embodiment of the present disclosure.

FIG. 1 schematically shows a structural diagram of a radiation detector according to an embodiment of the present disclosure. The radiation detector 100 includes a semiconductor crystal 101, a cathode 102, and an anode 103. The semiconductor crystal 101 may include radiation-sensitive semiconductor, such as any one of Ge, $HgI_2$, GaAs, TiBr, CdTe, CdZnTe, CdSe, GaP, HgS, $PbI_2$, and AlSb. In this embodiment, the semiconductor crystal 101 may have a cube shape including six surfaces, which are referred to as a "top surface," a "bottom surface," and four "side surfaces," respectively. The bottom surface and the top surface are opposite to each other. The four side surfaces adjoin the top surface at their respective top edges and adjoin the bottom surface at their respective bottom edges, respectively. The cathode 102 and anode 103 may each include a conductive material, such as any one of Au, Ag, Cu, Al, and ITO, etc. The cathode 102 may have a planar shape to cover the bottom surface and two side surfaces of the semiconductor crystal 101. The anode 103 may have a stripe shape arranged on the top surface of semiconductor crystal 101 to divide the top surface into two substantially symmetric parts. The cathode 102 and the anode 103 may extend in parallel with respect to each other to a length substantially equal to that of the anode 103, e.g., that of an edge of the semiconductor crystal 101. Note that the cathode 102 does not cover the two side surfaces perpendicular to a length direction of the anode 103.

Figure 2:
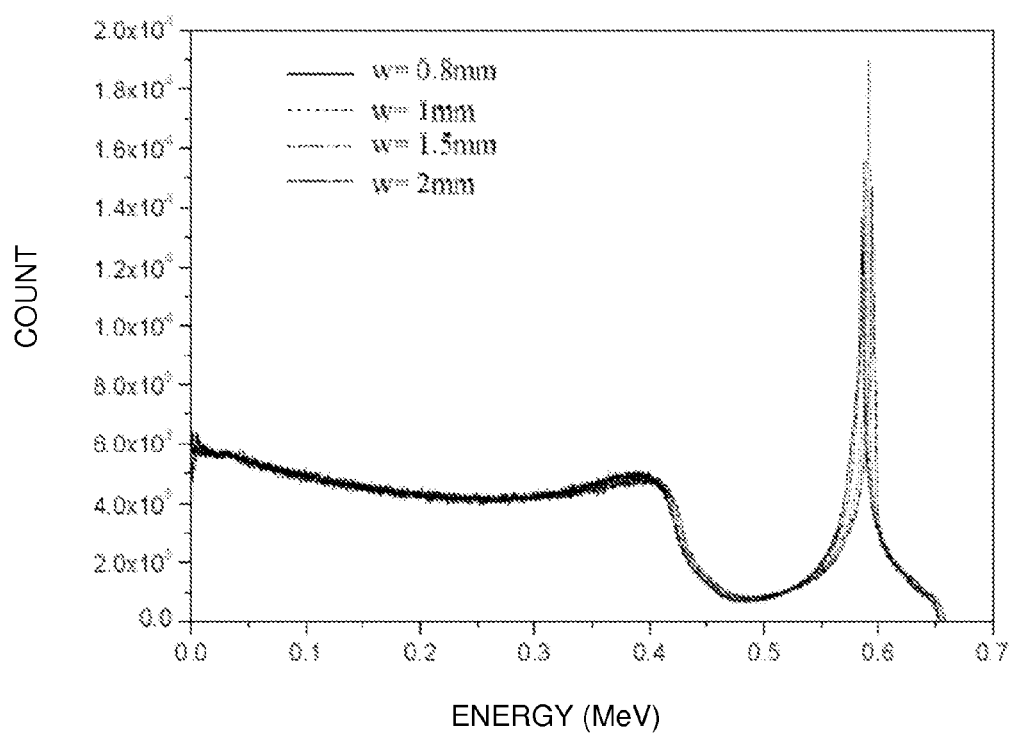
FIG. 2 schematically shows an energy spectrum of rays with energy of 662 keV calculated by the radiation detector shown in FIG. 1.

FIG. 2 schematically shows an energy spectrum of γ-rays with energy of 662 keV calculated by the radiation detector 100 shown in FIG. 1. In this embodiment, the semiconductor crystal 101 may have a cube shape having a size of 5 mm×5 mm×5 mm. The rays may have incident photon energy of 662 keV. Signals induced on the electrodes when charges produced by radiation are moving along electric lines of force in the electric field are calculated by simulation with respect to anode widths w of 0.8 mm, 1 mm, 1.5 mm, and 2 mm, respectively. The calculated signals are then combined to generate the energy spectrum. The calculation shows an obvious 662 keV full-energy spike in the energy spectrum of the radiation detector 100. The full-energy spike has different positions and resolutions for the different anode widths. There exists an optimal anode width which may ensure a high-intensity electric field in the entire crystal as well as sensitive to a single polarity simultaneously. The optimal anode width may vary according to the size of the crystal. In contrast, no obvious spikes exist in calculation results under similar conditions for a radiation detector having a planar anode and a planar cathode. Thus, the radiation detector 100 shown in FIG. 1 can improve energy resolution effectively.

Figure 3:
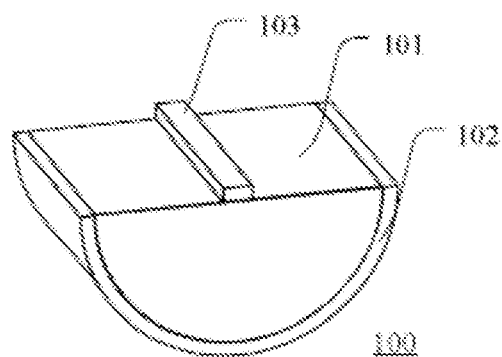
FIGS. 3a-3b schematically show structural diagrams of radiation detectors according to some other optional embodiments of the present disclosure.
Figure 3:
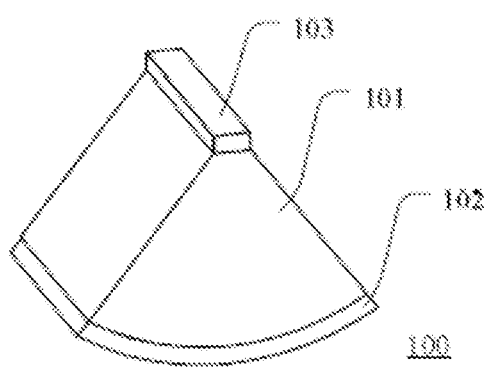

FIGS. 3a-3b schematically show structural diagrams of radiation detectors according to some other optional embodiments of the present disclosure.

The radiation detector 100 shown in FIG. 3a differs from that shown in FIG. 1 in that the semiconductor crystal 101 has a semi-cylinder shape. The top surface and the bottom surface may be a longitudinal-section surface and an arc surface of the semi-cylinder, respectively. The at least one side surface may include two cross-section surfaces of the semi-cylinder. The cathode 102 may cover the arc surface of the semiconductor crystal 101. The anode 103 may have a stripe shape arranged on the longitudinal-section surface of semiconductor crystal 101 to divide the longitudinal-section surface into two substantially symmetric parts. The cathode 102 and the anode 103 may extend in parallel with respect to each other to a length substantially equal to that of the anode 103, e.g., a height of the semi-cylinder. Note that the cathode 102 does not cover the cross-section surfaces perpendicular to a length direction of the anode 103.

The radiation detector 100 shown in FIG. 3b differs from that shown in FIG. 1 in that the semiconductor crystal 101 has a segment shape. The top surface and the bottom surface may be a longitudinal-section surface and an arc surface of the segment, respectively. The at least one side surface may include two cross-section surfaces and two radial-section surfaces of the segment. The cathode 102 may cover the arc surface of the semiconductor crystal 101. The anode 103 may have a stripe shape arranged on the longitudinal-section surface of semiconductor crystal 101 to divide the longitudinal-section surface into two substantially symmetric parts. The cathode 102 and the anode 103 may extend in parallel with respect to each other to a length substantially equal to that of the anode 103, e.g., a height of the segment. Note that the cathode 102 does not cover the cross-section surfaces perpendicular to a length direction of the anode 103.

The semiconductor crystal 101 having the semi-cylinder or segment shape may improve utilization rate of semiconductor ingot. For example, the semiconductor crystal 101 having the segment shape may be manufactured from leftover pieces of the semiconductor ingots.

FIGS. 4a-4f schematically show structural diagrams of radiation detectors according to some further optional embodiments of the present disclosure.

Figure 4:
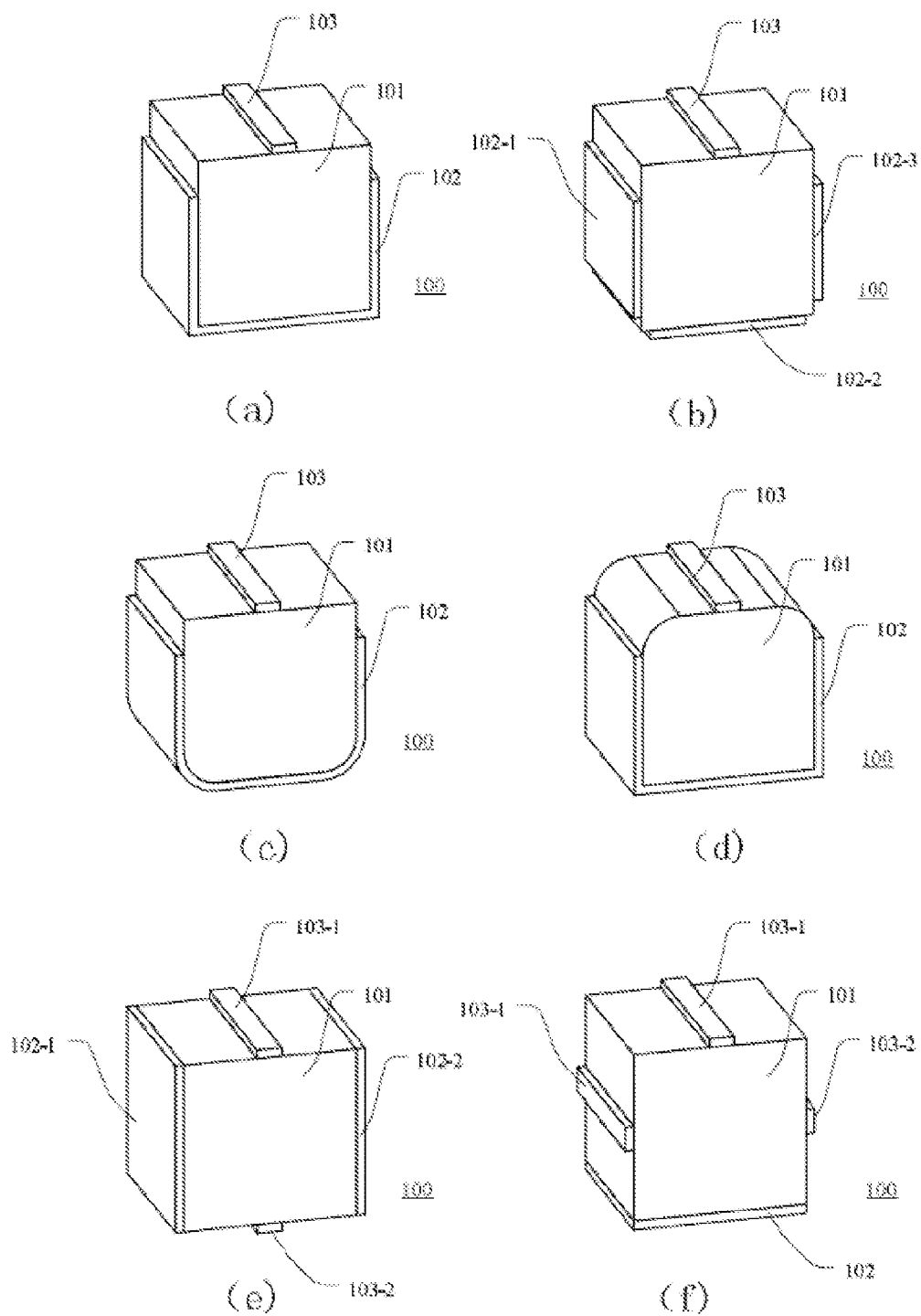
FIGS. 4a-4f schematically show structural diagrams of radiation detectors according to some further optional embodiments of the present disclosure.

The radiation detector 100 shown in FIG. 4a differs from that shown in FIG. 1 in that the cathode 102 may extend, on the side surfaces adjoining the bottom surface of the semiconductor crystal 101, from the bottom surface toward the top surface to a same height without covering the side surfaces completely. The height of the cathode 102 on the side surfaces may be adjusted according to the shape and size of the semiconductor crystal 101 to improve performances of the radiation detector 100.

The radiation detector 100 shown in FIG. 4b differs from that shown in FIG. 1 in that the cathode 102 may be partially removed at the respective edges between the bottom surface of the semiconductor crystal 101 and the side surfaces adjoining the bottom surface. The radiation detector 100 shown in FIG. 4c differs from that shown in FIG. 1 in that respective edges between the bottom surface of the semiconductor crystal 101 and the side surfaces adjoining the bottom surface may be rounded off. The radiation detector 100 shown in FIG. 4d differs from that shown in FIG. 1 in that respective edges between the top surface of the semiconductor crystal 101 and the side surfaces adjoining the top surface may be rounded off. Electric field distribution in the semiconductor crystal 101 can be improved by partially removing the cathode 102 (FIG. 4b) or performing rounding off (FIG. 4c) at the respective edges between the bottom surface of the semiconductor crystal 101 and the side surfaces adjoining the bottom surface, thereby reducing charge trapping at the edges and partially removing low-energy trails in the full-energy spikes. High-energy trails in the full-energy spikes can be partially removed by performing rounding off (FIG. 4d) at respective edges between the top surface of the semiconductor crystal 101 and the side surfaces adjoining the top surface.

The radiation detector 100 shown in FIG. 4e differs from that shown in FIG. 1 in that the cathode 102 may cover two side surfaces of the semiconductor crystal 101. Two anodes 103 may each be arranged on a respective one of the top surface and the bottom surface of the semiconductor crystal 101 and divide the same into two substantially symmetric parts. The cathode 102 and the anodes 103 may extend in parallel with respect to each other to a length substantially equal to that of the anode 103, e.g., an edge length of the semiconductor crystal 101. Note that the cathode 102 does not cover the two side surfaces perpendicular to a length direction of the anode 103. The radiation detector 100 shown in FIG. 4f differs from that shown in FIG. 1 in that the cathode 102 may cover the bottom surface of the semiconductor crystal 101. Three anodes 103 may each be arranged on a respective one of the top surface and two side surfaces of the semiconductor crystal 101 and divide the same into two substantially symmetric parts. The cathode 102 and the anodes 103 may extend in parallel with respect to each other to a length substantially equal to that of the anode 103, e.g., an edge length of the semiconductor crystal 101. Note that the cathode 102 does not cover the two side surfaces perpendicular to a length direction of the anode 103.

It is possible to collect signals from a plurality of surfaces of the semiconductor crystal 101 by forming a plurality of stripe anodes thereon. In this way, migration distances of charges can be reduced to alleviate charge trapping and improve the energy resolution.

Figure 5:
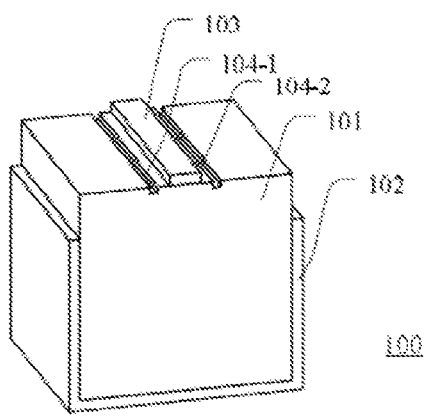
FIG. 5 schematically shows a structural diagram of a radiation detector according to another embodiment of the present disclosure.

FIG. 5 schematically shows a structural diagram of a radiation detector according to another embodiment of the present disclosure. The radiation detector 100 shown in FIG. 5 differs from that shown in FIG. 1 in that two grooves 104-1 and 104-2 may be formed in the top surface of the semiconductor crystal 101 at two opposite sideshow of the anode 103.

FIGS. 6a-6d schematically show structural diagrams of radiation detectors according to some yet further optional embodiments of the present disclosure.

Figure 6:
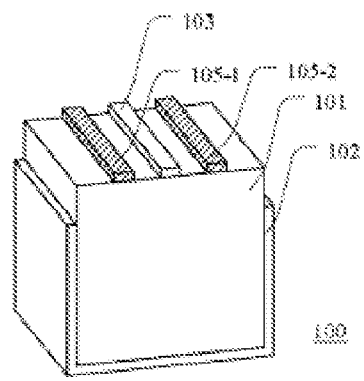
FIGS. 6a-6d schematically show structural diagrams of radiation detectors according to some yet further optional embodiments of the present disclosure.
Figure 6:
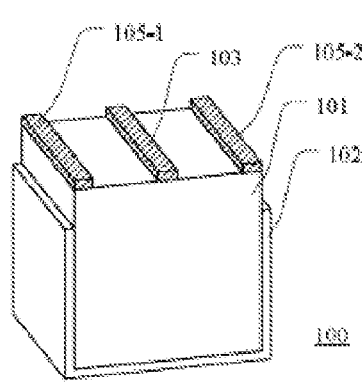
Figure 6:
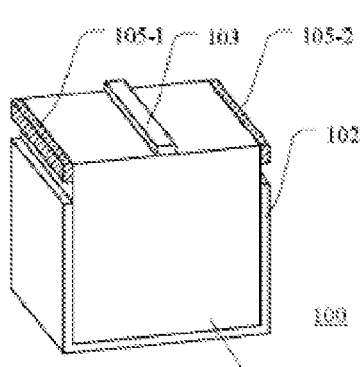
Figure 6:
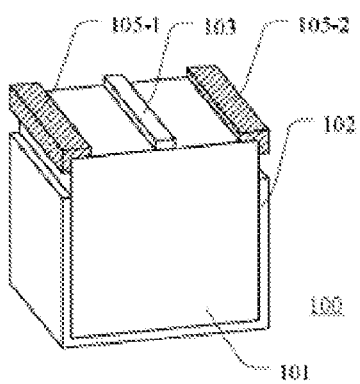

The radiation detector 100 shown in FIG. 6a differs from that shown in FIG. 1 in that two protective conductors 105-1 and 105-2 may be formed on the top surface of the semiconductor crystal 101 at two opposite sideshow of the anode 103. The radiation detector 100 shown in FIG. 6b differs from that shown in FIG. 1 in that two protective conductors 105-1 and 105-2 may be formed on the top surface of the semiconductor crystal 101 at two opposite sideshow of the anode 103 and near edges of the semiconductor crystal 101. The radiation detector 100 shown in FIG. 6c differs from that shown in FIG. 1 in that two protective conductors 105-1 and 105-2 may be formed on the side surfaces adjoining the top surface of the semiconductor crystal 101 and near the edges thereof. The radiation detector 100 shown in FIG. 6d differs from that shown in FIG. 1 in that two protective conductors 105-1 and 105-2 may be formed on respective edges between the top surface of the semiconductor crystal 101 and the side surfaces adjoining thereto. The protective conductors 105-1 and 105-2 may or may not be biased during operation of the radiation detector 100.

The electric field in the semiconductor crystal 101 may be shaped by the grooves 104-1 and 104-2 formed in the surface of the semiconductor crystal 101 at opposite sides of the anode or the protective conductors 105-1 and 105-2 formed on the surface of the semiconductor crystal 101, so as to reduce noise signals caused by surface leakage current.

Figure 7:
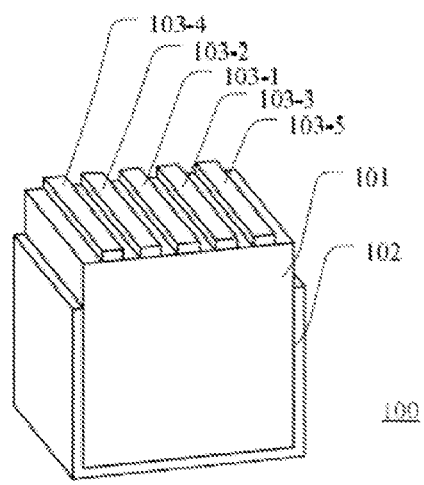
FIG. 7 schematically shows a structural diagram of a radiation detector according to yet another optional embodiment of the present disclosure.

FIG. 7 schematically shows a structural diagram of a radiation detector 100 according to yet another optional embodiment of the present disclosure. The radiation detector 100 shown in FIG. 7 differs from that shown in FIG. 1 in that the cathode 102 may extend, on the side surfaces adjoining the bottom surface of the semiconductor crystal 101, from the bottom surface toward the top surface without reaching the top surface, i.e., without cover the entire side surfaces of the semiconductor crystal 101. The anode 103 includes three or more sub-anodes (shown in FIG. 7 as five sub-anodes 103-1, 103-2, 103-3, 103-4, and 103-5) extending in parallel with respect to each other on the top surface of the semiconductor crystal 101. The plurality of sub-anodes are separated by small spaces and occupy a very narrow area at center of the top surface, thereby ensuring sensitivity of each sub-anode to a single polarity. The plurality of sub-anodes may be biased at a same voltage and are all used to collect signals in operation, thereby further improving electric field intensity in the semiconductor crystal 101 and efficiency of charge collection. Alternatively, the anode 103 may include three or more stripe sub-anodes arranged symmetrically on the top surface with one of the sub-anodes being arranged at a center of the top surface. The sub-anodes are separated by large spaceship and biased at different voltages. The sub-anode arranged at the center is used for signal collection. Voltages applied to the sub-anodes increase sequentially from respective edges between the top surface and the side surfaces to the center of the top surface. For example, desired electric field distribution can be generated in the semiconductor crystal 101 by two or more of the sub-anodes so as to improve efficiency of charge collection and remove high-energy trails in the energy spectrum.

Figure 8:
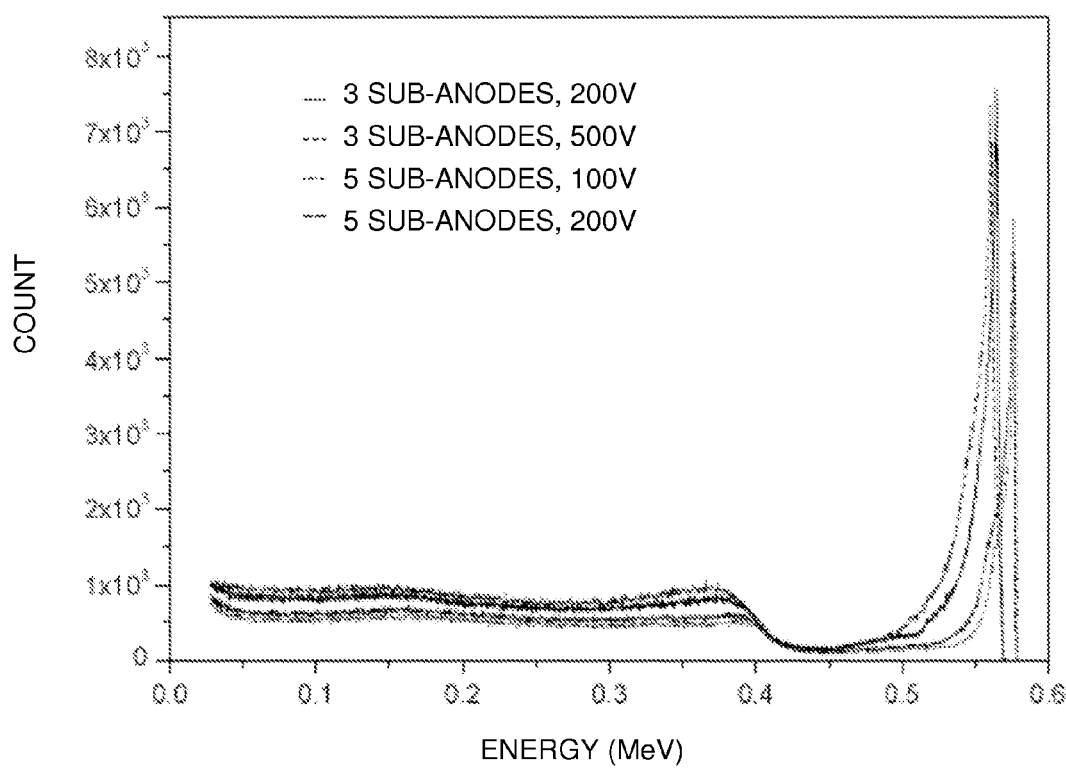
FIG. 8 schematically shows an energy spectrum of rays with energy of 662 keV calculated by the radiation detector shown in FIG. 7.

FIG. 8 schematically shows a plot diagram of calculation results of detection efficiency of the radiation detector 100 shown in FIG. 7. In this embodiment, the semiconductor crystal 101 is a cuboid having a size of 20 mm×20 mm×15 mm. Incident photon energy is set to 662 keV. Different voltages are applied to three or five sub-anodes with a highest voltage being applied to the central sub-anode. The voltages applied to the other sub-anodes decrease sequentially as the distance between the respective sub-anode and the central sub-anode increases. A plot denoted by "3 sub-anodes, 200 V" indicates a case where the anode 103 includes three sub-anodes and a difference between respective voltages applied to the sub-anodes is 200 V. A plot denoted by "3 sub-anodes, 500 V" indicates a case where the anode 103 includes three sub-anodes and a difference between respective voltages applied to the sub-anodes is 500 V. A plot denoted by "5 sub-anodes, 100 V" indicates a case where the anode 103 includes five sub-anodes and a difference between respective voltages applied to the sub-anodes is 100 V. A plot denoted by "5 sub-anodes, 200 V" indicates a case where the anode 103 includes five sub-anodes and a difference between respective voltages applied to the sub-anodes is 200 V. As shown in the figure, different voltages are applied to the sub-anodes, resulting in different energy resolutions in the energy spectrums and different efficiencies of charge collection.

Signals induced on the anodes when charges produced from radiation move along electric lines of force in the electric field can be calculated by simulation. The calculated shows good full-energy spikes with improved low-energy trails while without high-energy trails. The energy resolution is improved as the anode 103 includes more sub-anodes. In contrast, calculation for a radiation detector including a planar anode and a planar cathode does not show an obvious spike. Thus, the radiation detector 100 shown in FIG. 7 can improve the energy resolution effectively.

In a further optional embodiment of the present disclosure, the radiation detector 100 may include a plurality of semiconductor crystals arranged in a lateral or longitudinal direction. For each semiconductor crystal there may be arranged a stripe anode and a planar or curved cathode. Such a radiation detector 100 may have a larger detection volume, thereby improving detection efficiency. The detection efficiency may exhibit a substantial improvement for high-energy γ or X-RAYs with a small increase in the number of output signals. A pixel array may be formed for imaging by using each semiconductor crystal as a pixel.

In a further optional embodiment of the present disclosure, a detection volume of the radiation detector 100 may be increased by increasing a length of the anode 103 and a dimension of the semiconductor crystal 101 in the same direction without increasing movement distance of the charges. In contrast, a conventional planar-array CdZnTe detector has a maximum thickness of CdZnTe crystal of about 15 mm due to high voltages and limitations of charge mobility and lifetime.

In a further optional embodiment of the present disclosure, the radiation detector 100 may include a plurality of semiconductor crystals arranged in a lateral or longitudinal direction. Each of the semiconductor crystals may include a stripe anode and a planar or curved cathode. Between the respective semiconductor crystals there may be arranged a shield layer. The radiation detector 100 including the shield layers can implement ray detection sensitive to directions, which makes it particularly suitable for portable γ spectrometer.

The exemplary embodiments of the present disclosure have been described in detail as above. Those skilled in the art will understand that various changes or modifications can be made to these embodiments without departing from the principle and spirit of the present disclosure. The scope of the present disclosure will cover all of such changes and modifications.

The invention claimed is:

1. A radiation detector, comprising:
a semiconductor crystal for detecting radiation, the semiconductor crystal comprising a top surface, a bottom surface, and at least one side surface;
at least one anode arranged on at least one of the top surface, the bottom surface, and the at least one side surface; and
at least one cathode arranged on at least another one of the top surface, the bottom surface, and the at least one side surface,
wherein the at least one anode each has a stripe shape, the at least one cathode each has a planar or curved shape, and the at least one cathode and the at least one anode extend in parallel with respect to each other to a length substantially equal to that of the anode,
wherein the at least one anode is arranged on the top surface of the semiconductor crystal, and the at least one cathode is arranged on the bottom surface of the semiconductor crystal and the side surfaces adjoining the bottom surface, and
wherein respective edges between the bottom surface and the side surfaces adjoining the bottom surface are rounded off.

2. The radiation detector according to claim 1, wherein the semiconductor crystal is used for detecting X or γ-rays.

3. The radiation detector according to claim 1, wherein:
the semiconductor crystal has a cuboid shape;
the top surface and the bottom surface are two arbitrary opposite surfaces of the cuboid, respectively; and
the at least one side surface comprises the other four surfaces of the cuboid.

4. The radiation detector according to claim 1, wherein:
the semiconductor crystal has a cube shape;
the top surface and the bottom surface are two arbitrary opposite surfaces of the cube, respectively; and
the at least one side surface comprises the other four surfaces of the cube.

5. The radiation detector according to claim 1, wherein:
the semiconductor crystal has a semi-cylinder shape;
the top surface and the bottom surface are a longitudinal-section surface and an arc surface of the semi-cylinder, respectively; and
the at least one side surface comprises two cross-section surfaces of the semi-cylinder.

6. The radiation detector according to claim 1, wherein:
the semiconductor crystal has a segment shape;
the top surface and the bottom surface are a longitudinal-section surface and an arc surface of the segment, respectively; and
the at least one side surface comprises two cross-section surfaces and two radial-section surfaces of the segment.

7. The radiation detector according to claim 1, wherein the at least one anode is arranged centrally on the at least one of the top surface, the bottom surface, and the at least one side surface in a substantially symmetric manner.

8. The radiation detector according to claim 7, wherein the at least one anode each comprises a plurality of sub-anodes extending in parallel with respect to each other.

9. The radiation detector according to claim 7, the at least one anode is arranged on at least one of the top surface and the bottom surface of the semiconductor crystal.

10. The radiation detector according to claim 7, wherein the at least one anode is arranged on at least one of the top surface of the semiconductor crystal and the side surfaces adjoining the top surface.

11. The radiation detector according to claim 1, wherein the at least one cathode each covers the entire surface, on which it is arranged, of the semiconductor crystal.

12. The radiation detector according to claim 1, wherein the at least one cathode each extends, on the side surfaces adjoining the bottom surface, from the bottom surface toward the top surface without reaching the top surface.

13. The radiation detector according to claim 1, wherein the at least one cathode is each partially removed at respective edges between the bottom surface and the side surfaces adjoining the bottom surface.

14. The radiation detector according to claim 1, wherein respective edges between the top surface and the side surfaces adjoining the top surface are rounded off.

15. The radiation detector according to claim 1, further comprises grooves formed in the surface of the semiconductor crystal at opposite sides of each of the at least one anode and in parallel thereto.

16. The radiation detector according to claim 1, further comprises protective conductors formed on the surface of the semiconductor crystal at opposite sides of each of the at least one anode and in parallel thereto.

17. The radiation detector according to claim 16, wherein the protective conductors and the at least one anode are arranged on a same surface of the semiconductor crystal.

18. The radiation detector according to claim 16, wherein the protective conductors and the at least one anode are arranged on surfaces of the semiconductor crystal adjoining to each other, respectively.

19. The radiation detector according to claim 16, wherein the protective conductors are arranged on respective edges between the surface, on which the at least one anode is arranged, and surfaces adjoining thereto.

20. The radiation detector according to claim 1, wherein the semiconductor crystal is any one of Ge, $HgI_2$, GaAs, TiBr, CdTe, CdZnTe, CdSe, GaP, HgS, $PbI_2$, and AlSb.

* * * * *